United States Patent
Oh et al.

(10) Patent No.: US 11,393,768 B2
(45) Date of Patent: Jul. 19, 2022

(54) SEMICONDUCTOR PACKAGE AND MANUFACTURING METHOD THEREOF

(71) Applicant: Nepes CO., LTD., Samseong-myeon (KR)

(72) Inventors: Dong Hoon Oh, Cheongju-si (KR); Su Yun Kim, Cheongju-si (KR); Ju Hyun Nam, Cheongju-si (KR)

(73) Assignee: NEPES CO., LTD., Samseong-myeon (KR)

( * ) Notice: Subject to any disclaimer, the term of this patent is extended or adjusted under 35 U.S.C. 154(b) by 0 days.

(21) Appl. No.: 17/026,343

(22) Filed: Sep. 21, 2020

(65) Prior Publication Data

US 2021/0091008 A1 Mar. 25, 2021

(30) Foreign Application Priority Data

Sep. 20, 2019 (KR) .................. 10-2019-0116092

(51) Int. Cl.
*H01L 23/538* (2006.01)
*H01L 23/29* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC .......... H01L 23/5389; H01L 23/49811; H01L 23/49816; H01L 23/36; H01L 21/4853;
(Continued)

(56) References Cited

U.S. PATENT DOCUMENTS

| 9,214,411 B2 | 12/2015 | Park et al. |
| 2015/0069623 A1 * | 3/2015 | Tsai ............... H01L 21/6836 257/774 |

(Continued)

FOREIGN PATENT DOCUMENTS

| KR | 20090031289 A | 3/2009 |
| KR | 20140146675 A | 12/2014 |

(Continued)

*Primary Examiner* — Kyoung Lee
*Assistant Examiner* — Christina A Sylvia
(74) *Attorney, Agent, or Firm* — Bayramoglu Law Offices LLC

(57) ABSTRACT

A semiconductor package having improved impact resistance and excellent heat dissipation and electromagnetic wave shielding property, and a manufacturing method thereof are provided. There is provided a semiconductor package including: a chip having a contact pad provided on one surface thereof; a buffer layer formed on one surface of the chip; one or more wiring patterns disposed on the buffer layer, electrically connected to the contact pad of the chip, and extended to an outside of the chip; an external pad provided on the wiring pattern and electrically connected to the wiring pattern; an external connection terminal electrically connected to the external pad; and a mold layer formed to surround the other surface and a side surface of the chip and a side surface of the buffer layer, and formed up to the other surface of the wiring pattern.

14 Claims, 17 Drawing Sheets

(51) Int. Cl.
*H01L 23/367* (2006.01)
*H01L 23/552* (2006.01)
*H01L 23/00* (2006.01)
*H01L 21/48* (2006.01)
*H01L 21/56* (2006.01)
*H01L 21/683* (2006.01)
*H01L 23/31* (2006.01)

(52) U.S. Cl.
CPC .......... *H01L 21/565* (2013.01); *H01L 21/568* (2013.01); *H01L 21/6835* (2013.01); *H01L 23/295* (2013.01); *H01L 23/3128* (2013.01); *H01L 23/367* (2013.01); *H01L 23/5383* (2013.01); *H01L 23/5386* (2013.01); *H01L 23/552* (2013.01); *H01L 24/19* (2013.01); *H01L 24/20* (2013.01); *H01L 2221/68372* (2013.01); *H01L 2224/214* (2013.01); *H01L 2924/3025* (2013.01)

(58) Field of Classification Search
CPC . H01L 21/4857; H01L 21/565; H01L 21/568; H01L 21/6835; H01L 21/56; H01L 23/295; H01L 23/3128; H01L 23/367; H01L 23/5383; H01L 23/5386; H01L 23/552; H01L 23/3672; H01L 23/562; H01L 23/293; H01L 23/34; H01L 23/485; H01L 23/525; H01L 24/19; H01L 24/20; H01L 24/11; H01L 24/13; H01L 24/06; H01L 2221/68372; H01L 2221/68359; H01L 2224/214; H01L 2224/04105; H01L 2224/111; H01L 2224/13009; H01L 2924/3025; H01L 2924/1815; H01L 2924/18162; H01L 25/0657; H01L 2225/06513; H01L 2225/06548
See application file for complete search history.

(56) References Cited

U.S. PATENT DOCUMENTS

| | | | |
|---|---|---|---|
| 2015/0200153 A1* | 7/2015 | Wang | H01L 21/76802 |
| | | | 257/774 |
| 2015/0243575 A1 | 8/2015 | Strothmann et al. | |
| 2018/0158787 A1* | 6/2018 | Chang | H01L 23/552 |
| 2018/0374801 A1* | 12/2018 | Jeng | H01L 21/0217 |
| 2019/0027446 A1* | 1/2019 | Cheng | H01L 21/6835 |
| 2019/0237407 A1* | 8/2019 | Lee | H01L 23/3114 |

FOREIGN PATENT DOCUMENTS

| | | |
|---|---|---|
| KR | 20170004796 A | 1/2017 |
| KR | 20180020860 A | 2/2018 |
| KR | 20190096562 A | 8/2019 |

\* cited by examiner

SEMICONDUCTOR PACKAGE AND MANUFACTURING METHOD THEREOF

CROSS-REFERENCE TO THE RELATED APPLICATIONS

This application is based upon and claims priority to Korean Patent Application No. 10-2019-0116092, filed on Sep. 20, 2019; the disclosure of which is incorporated herein by reference in its entirety.

TECHNICAL FIELD

The present disclosure relates to a semiconductor package and a manufacturing method thereof, and more particularly, to a semiconductor package having improved impact resistance and excellent heat dissipation and electromagnetic wave shielding property, and a manufacturing method thereof.

BACKGROUND

In general, semiconductor packages are manufactured by performing a semiconductor packaging process on semiconductor chips manufactured by performing various semiconductor processes on a wafer. Recently, in order to reduce the manufacturing costs of the semiconductor packages, a wafer-level packaging technique is proposed in which the semiconductor packaging process is performed at a wafer level, and a wafer-level semiconductor package subjected to the semiconductor packaging process is individualized into individual units.

Meanwhile, as illustrated in FIG. 1, the semiconductor package is mounted on a board through external connection terminals protruding from an outside of the semiconductor package.

However, the semiconductor package may be exposed to physical impact or the like during operation or during manufacturing or may be exposed to various shocks such as thermal shock or the like that may be applied due to heat generation and cooling.

Further, when heat generated during operation is accumulated, problems such as operation failures, malfunctions, or the like may occur, and electromagnetic interference (EMI) generated during operation may cause nearby devices to malfunction.

SUMMARY

The present disclosure is directed to providing a semiconductor package having a structure resistant to physical impact, thermal shock, or the like and a manufacturing method thereof.

The present disclosure is also directed to providing a semiconductor package capable of dissipating heat and shielding electromagnetic interference (EMI) and a manufacturing method thereof.

It should be noted that objects of the present disclosure are not limited to the above-described objects, and other objects of the present disclosure will be apparent to those skilled in the art from the following descriptions.

According to an aspect of the present disclosure, there is provided a semiconductor package including a chip having a contact pad provided on one surface thereof, a buffer layer formed on one surface of the chip, one or more wiring patterns which are disposed on the buffer layer, electrically connected to the contact pad of the chip, and extended to an outside of the chip, and a mold layer which is formed to surround a side surface of the chip, formed to be higher than a corner of one surface of the chip, and formed up to the other surface of the wiring pattern.

The semiconductor package may further include an insulating layer formed on an outside of the buffer layer so as to cover the buffer layer and the wiring pattern.

The insulating layer and the mold layer may be formed of materials having coefficients of thermal expansion whose difference is in a range of 0 to 25 ppm/° C.

The insulating layer and the mold layer may be in direct contact with each other in at least some sections.

The semiconductor package may further include an external connection terminal configured to transmit an electrical signal to an external device, an external pad provided on the insulating layer and having the external connection terminal disposed thereon, and a conductive via formed between the external pad and the wiring pattern.

A height of the insulating layer may be in a range of 10 to 50 μm.

The conductive via may have a height corresponding to 0 to 95% of a height of the insulating layer.

Each of the insulating layer and the mold layer may be formed of a non-photosensitive material.

Each of the insulating layer and the mold layer may include a filler, and a diameter of the filler may be less than or equal to ¼ times a thickness of the insulating layer.

The insulating layer and the mold layer may be drilled by a laser, and each of a portion of the insulating layer and a portion of the mold layer, which are drilled by the laser, may be formed to have an inclined side surface so that an inner diameter thereof is gradually decreased toward an inside thereof.

An object to be exposed, which is exposed by being drilled, may be over-etched by the laser, and a range in which the object to be exposed is over-etched may be between 0.01% and 30% of a thickness of the object to be exposed.

The semiconductor package may include the mold layer formed to surround the other surface and the side surface of the chip.

The semiconductor package may include a metal shielding layer formed on the other surface of the chip, which is a surface opposite to one surface of the chip, and the other surface of the mold layer.

The semiconductor package may include a metal shielding layer of a metal material formed to surround the other surface and a side surface of the mold layer, and a side surface of the insulating layer.

An oxide passivation layer may be formed on the wiring pattern.

The semiconductor package may further include an embedded ground portion, which is formed inside the mold layer, and includes one side electrically connected to a ground electrode among the plurality of wiring patterns and the other side electrically connected to the metal shielding layer.

According to another aspect of the present disclosure, there is provided a method of manufacturing a semiconductor package, and the method includes a first carrier attaching operation of forming a buffer layer on one surface of a chip, on which a contact pad is formed, and attaching the buffer layer of the chip to a first carrier, a mold layer forming operation of forming a mold layer so as to surround the other side surface and a side surface of the chip to which the first carrier is attached, and a side surface of the buffer layer, a second carrier attaching operation of turning over the chip on which the mold layer is formed and attaching the other surface of the chip to a second carrier, a disposing operation of disposing one or more wiring patterns, which are electrically connected to the contact pad of the chip and extended to an outside of the chip, on one surface of the buffer layer, an insulating layer forming operation of forming an insulating layer on one side of the wiring pattern, an exposing operation of removing a portion of the insulating layer so that a portion of the wiring pattern is exposed, and a build-up operation of disposing an external pad and an external connection terminal in the exposed wiring pattern.

The exposing operation may be an operation of exposing the wiring pattern by removing a portion of the insulating layer through a polishing operation.

The exposing operation may be an operation of exposing the wiring pattern by drilling a portion of the insulating layer through a laser.

In the first carrier attaching operation, an embedded ground portion extending in one side direction and the other side direction may be further disposed on the first carrier, and the method may further include a grinding operation, which is performed before the second carrier attaching operation, of grinding the other surface of the mold layer formed in the mold layer forming operation until the other surface of the chip and the other end of the embedded ground portion are exposed so that the other surface of the mold layer is coplanar with the other surface of the chip and the other end of the embedded ground portion, and a metal shielding layer disposing operation of disposing a metal shielding layer to be in contact with the other surface of each of the chip and the mold layer and the other end of the embedded ground portion.

BRIEF DESCRIPTION OF THE DRAWINGS

The above and other objects, features, and advantages of the present disclosure will become more apparent to those of ordinary skill in the art by describing exemplary embodiments thereof in detail with reference to the accompanying drawings, in which.

DETAILED DESCRIPTION OF THE EMBODIMENTS

Figure 1:
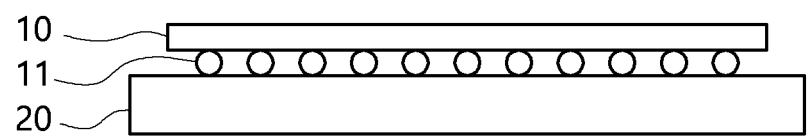
FIG. 1 is a view illustrating a conventional semiconductor chip package.

Hereinafter, the exemplary embodiments for specifically realizing the objects of the present disclosure will be described with reference to the accompanying drawings. In describing the present embodiments, the same designations and reference numerals are used for the same components, and additional descriptions thereof will be omitted.

Figure 2:
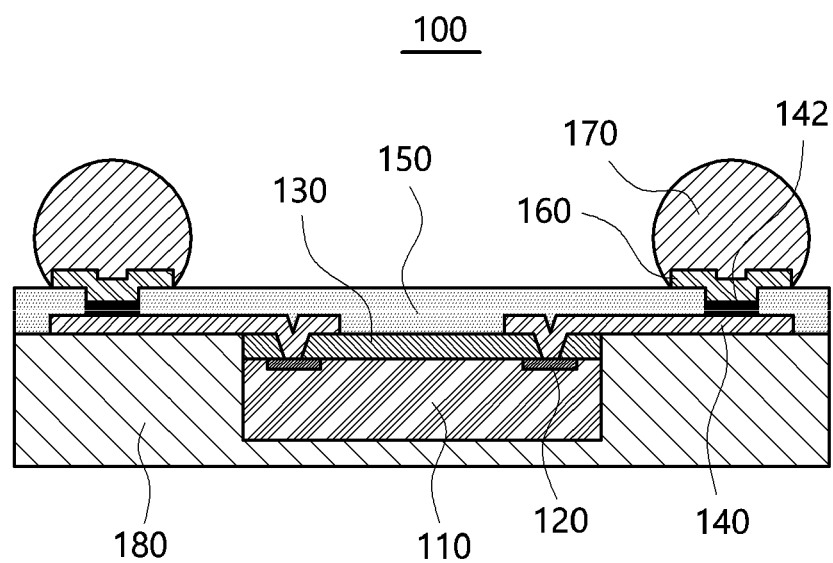
FIG. 2 is a cross-sectional view illustrating a semiconductor chip package according to a first embodiment of the present disclosure.

As illustrated in FIG. 2, a semiconductor package 100 according to one embodiment of the present disclosure may include a chip 110, a buffer layer 130, wiring patterns 140, an insulating layer 150, an external pad 160, an external connection terminal 170, and a mold layer 180.

The chip 110 may include various types of one or a plurality of individual devices as a semiconductor device. For example, the plurality of individual devices may include microelectronic devices, complementary metal-oxide semiconductor (CMOS) transistors, metal-oxide semiconductor field effect transistors (MOSFETs), system large scale integration (LSI) devices, optoelectronic devices such as CMOS imaging sensors (CISs), microelectromechanical systems (MEMS), bulk acoustic wave (BAW) filter devices, active devices, passive devices, and the like, but the present disclosure is not limited thereto.

The chip 110 may be a memory semiconductor chip. For example, the memory semiconductor chip may be a volatile memory semiconductor chip such as a dynamic random access memory (DRAM) or a static RAM (SRAM), or a nonvolatile memory semiconductor chip such as a phase-change RANI (PRAM), a magneto-resistive RAM (MRAM), a ferroelectric RAM (FeRAM), or a resistive RAM (RRAM), but the present disclosure is not limited thereto.

The chip 110 may be a logic chip. For example, the logic chip may be a central processor unit (CPU), a micro processor unit (MPU), a graphic processor unit (GPU), or an application processor (AP), but the present disclosure is not limited thereto.

In FIG. 2, the chip 110 is illustrated as being a single semiconductor device chip but is not limited thereto and may include a plurality of semiconductor devices, and the plurality of semiconductor devices may be semiconductor devices of the same type or different types.

In addition, the semiconductor package 100 may be a system-in-package (SiP) in which different types of semiconductor device chips are electrically connected to each other to operate as a single system.

A contact pad 120 may be formed on one surface of the chip 110. In FIG. 2, a surface facing an upper side may be one surface, and a surface facing a lower side opposite to the upper side may be the other surface. In the following descriptions, a surface or an end in a direction in which the contact pad 120 is formed on the chip 110 is referred to as one surface or one end, and a surface or an end in a direction opposite to one surface or one end is referred to as the other surface or the other end.

The contact pad 120 may perform a role of a passage through which the chip 110 is electrically connected to various types of individual devices formed on the chip 110 and may transmit input or output signals of the chip 110. The contact pad 120 may be made of a non-resistive metal such as aluminum or copper, but the present disclosure is not limited thereto. In addition, it is illustrated in the drawing that there are two contact pads 120, but the present disclosure is not limited to the number of contact pads 120.

The buffer layer 130 may be formed on one surface of the chip 110, may be formed of a non-conductive material to prevent an unnecessary electrical short circuit, and may protect one surface of the chip 110.

The wiring pattern 140 may be disposed on the buffer layer 130, may be formed of a conductive material to be electrically connected to the contact pad 120 of the chip, and may be formed to extend to an outside of the chip 110 in a lateral direction.

Since the wiring pattern 140 may be formed of a conductive material to be electrically connected to the contact pad 120, a path through which the chip is electrically connected to an external device or a substrate may be formed.

The wiring pattern 140 may be disposed on an upper side of the buffer layer 130 and may extend toward a side surface of the chip 110 and may be electrically connected to the contact pad by forming a notch protruding toward the contact pad at a point corresponding to the contact pad 120 of the chip 110 and being in contact with the contact pad while passing through the buffer layer. The wiring pattern may be made of tungsten (W), copper (Cu), zirconium (Zr), titanium (Ti), tantalum (Ta), aluminum (Al), ruthenium (Ru), palladium (Pd), platinum (Pt), cobalt (Co), nickel (Ni), or a combination thereof, and the present disclosure is not limited thereto as the material of the wiring pattern 140.

The insulating layer 150 may be formed on an outside of the buffer layer 130 and may be formed to cover the buffer layer 130 and the wiring pattern 140.

Accordingly, the wiring pattern 140 may be covered by the buffer layer 130 and the insulating layer 150 and thus may be protected from physical or chemical damage.

The buffer layer 130 and the insulating layer 150 may be made of an insulating polymer, an epoxy, a silicon oxide film, a silicon nitride film, an insulating polymer, or a combination thereof. Alternatively, the buffer layer 130 and the insulating layer 150 may each be made of a non-photosensitive material or a photosensitive material. For example, the insulating polymer may include general-purpose polymers such as polymethyl methacrylate (PMMA), polystyrene (PS), polybenzoxazole (PBO), and the like, acrylic-based polymers, imide-based polymers, aryl ether-based polymers, amide-based polymers, fluorine-based polymers, p-xylene-based polymers, vinylalcohol-based polymers, polymer derivatives having a phenol-based group, or a combination thereof.

Further, the buffer layer 130 and the insulating layer 150 may be made of different materials. For example, one of the buffer layer 130 and the insulating layer 150 may be made of a non-photosensitive material, for example, non-photosensitive polyimide, and the other one thereof may be made of a photosensitive material such as photosensitive polyimide. Alternatively, the buffer layer 130 and the insulating layer 150 may be made of the same material.

Of course, the material of each of the buffer layer 130 and the insulating layer 150 is not limited to those described above and may include more various materials.

Further, a height (thickness) of the insulating layer 150 may be in a range of 10 to 50 µm and, preferably, may be 30 µm±3 µm.

The external pad 160 may be provided on the insulating layer 150 and may function as a pad on which the external connection terminal 170 is disposed. The external pad 160 may be electrically connected to the wiring pattern 140 and may be electrically connected to the contact pad 120 of the chip through the wiring pattern 140.

To this end, the external pad 160 may form a wetting layer having an excellent wettability to allow the external connection terminal 170 to be properly adhered thereto.

For example, the external pad 160 may be an under bump metal (UBM) layer and may include a metal material such as Cu, Al, chromium (Cr), W, Ni, Ti, gold (Au), silver (Ag), or a combination thereof having excellent conductivity, but the present disclosure is not limited thereto.

Alternatively, as illustrated on a right side of FIG. 2, a conductive via 142 may be formed between the external pad 160 and the wiring pattern 140. The conductive via 142 may be provided to electrically connect the external pad 160 to the wiring pattern 140. In addition, the conductive via 142 may be formed of a single layer or may also be formed of a plurality of layers made of different materials.

By providing the conductive via 142 as described above, the insulating layer 150 may be formed to have a greater thickness. That is, since the conductive via 142 is provided between the external pad 160 and the wiring pattern 140, it is possible to electrically connect the external pad 160 to the wiring pattern 140 even when the insulating layer 150 is formed to have a greater thickness so that difficulty in electrically connecting the external pad 160 to the wiring pattern 140 may be eliminated. Accordingly, since the insulating layer 150 may be formed to be thicker, the effect of protecting the chip 110 may be increased, thereby improving reliability.

For example, the conductive via 142 may be formed to have a height corresponding to a range of 0 to 95% of the height (thickness) of the insulating layer 150. As one example, the height of the conductive via 142 may be in a range of 10 to 47 μm and may preferably be in a range of 24±5 μm.

The external connection terminal 170 is a terminal which transmits an electrical signal from the semiconductor package 100 to an external device such as a substrate and may be collapsed and bonded on the external pad 160. The external connection terminal 170 may be electrically connected to the chip through the wiring pattern 140 and may electrically connect the semiconductor package 100 to an external device (e.g., a board or the like).

That is, the external connection terminal 170 may be a connection terminal for mounting the semiconductor package 100 on a board such as a printed circuit board, which is an external device.

The external connection terminal 170 may include a solder bump and may include tin (Sn), Au, Ag, Ni, indium (In), bismuth (Bi), antimony (Sb), Cu, zinc (Zn), lead (Pb), or a combination thereof, but the present disclosure is not limited thereto. In addition, the solder bump may be formed in a ball shape but may be formed in various shapes such as, but not limited to, a cylinder, a polygonal column, a polyhedron, or the like.

Meanwhile, the mold layer 180 may be formed to surround the other surface and the side surface of the chip 110 and a side surface of the buffer layer 130. The mold layer 180 may be formed up to a lower side surface of the wiring pattern 140 and may be formed to be in contact with the insulating layer 150 to protect the chip, the buffer layer 130, and the wiring pattern 140.

That is, the mold layer 180 may be formed to be higher than one surface of the chip 110 and may be formed to be at the same height as the buffer layer 130 so as to be coplanar with the buffer layer 130. Accordingly, corner portions of the chip 110 are surrounded and covered by the mold layer 180 and the buffer layer 130, and thus the chip 110 may be protected by the load and impact applied from the outside, thereby enhancing impact resistance.

Accordingly, the side surface of each of the chip 110 and the buffer layer 130 and the wiring pattern is surrounded by the mold layer 180, thereby protecting the chip 110, the buffer layer 130, and the wiring pattern 140 from physical or chemical damage.

The mold layer 180 may be formed of an epoxy of a non-conductive material but is not necessarily limited thereto and may be formed of various materials such as an insulating polymer.

For example, the mold layer 180 may be formed of the same material or a material having the same physical properties as the insulating layer 150. At this point, the same physical properties may mean the same coefficient of thermal expansion. Accordingly, since coefficients of thermal expansion (CTE) of the mold layer 180 and the insulating layer 150 are the same, the semiconductor package 100 is prevented from being bent or distorted due to heat generated by the chip 110. Of course, the mold layer 180 and the insulating layer 150 may be formed of materials having coefficients of thermal expansion whose difference is in a range of 0 to 25 ppm/° C.

In addition, the insulating layer 150 and the mold layer 180 may be in direct contact with each other in at least some sections. Here, the insulating layer 150 and the mold layer 180 have the same physical properties and thus may have better mutual adhesion than a case when the insulating layer 150 and the mold layer 180 have materials of different physical properties. In this case, as illustrated in FIG. 2, the wiring pattern 140 is disposed between the insulating layer 150 and the mold layer 180, and since the insulating layer 150 and the mold layer 180 are firmly adhered to upper and lower sides of the wiring pattern 140, respectively, the wiring pattern 140 may also be firmly fixed.

Meanwhile, generally, photosensitive materials tend to have poor wettability or adhesion with metal materials, and non-photosensitive materials tend to have excellent wettability or adhesion with metal materials. Accordingly, when the insulating layer 150 and the mold layer 180 are formed of a non-photosensitive material, the insulating layer 150 and the mold layer 180 may have excellent adhesion with the wiring pattern 140 that is a metal material, and thus the wiring pattern 140 may be more reliably fixed.

Meanwhile, as necessary, the buffer layer 130 may not be disposed, and the wiring pattern 140 may be disposed directly on one surface of the chip 110. Alternatively, the buffer layer 130 may be formed to have a thickness greater than that of the mold layer 180. In this case, the wiring pattern may be formed on one surface of the chip in a shape bent upward.

Here, the non-photosensitive material for forming the insulating layer 150 and the mold layer 180 may have fillers mixed therein for various reasons, and the filler mixed in the insulating layer 150 and the filler included in the mold layer 180 may be the same type or different types. In addition, filler particles mixed in the insulating layer 150 and filler particles included in the mold layer 180 may have the same size and diameter or may have different sizes and diameters. Of course, as described above, distortion may occur due to the difference in thermal deformation when the difference in physical properties of the insulating layer 150 and the mold layer 180 is great, and thus, in order to lower the difference in physical properties, the fillers may be blended such that the difference between the size and diameter of the filler mixed in the insulating layer 150 and the size and diameter of the filler included in the mold layer 180 is not great. In this case, the filler mixed in the insulating layer 150 and the filler included in the mold layer 180 may have the same diameter or different diameters.

The filler is a particle having a diameter less than the thickness of the corresponding insulating layer and may increase CTE of the corresponding insulating layer, thereby improving effective CTE of each of the insulating layer 150 and the mold layer 180. That is, the filler may be a material having a CTE greater than a CTE of a main insulating material constituting the corresponding insulating layer. For example, the filler may have a diameter of less than or equal to about ¼ of a thickness of the corresponding insulating layer and may have a diameter in a range of about 0.1 to 10 μm, but the present disclosure is not limited thereto. Preferably, the filler may have a diameter of 5 μm or less. However, when the filler has a diameter greater than the corresponding limitation, the filler may cause a surface of the corresponding insulating layer to have a plurality of recessed structures that are too uneven, and thus properties such as surface adhesion of the corresponding insulating layer may be degraded. For example, the filler may include silica ($SiO_2$) or the like, but the present disclosure is not limited thereto.

Meanwhile, in order to electrically connect the external pad 160 to the external connection terminal 170, a portion of the insulating layer 150 covered on an upper side of the wiring pattern 140 needs to be etched to expose the wiring pattern 140. In general, when the insulating layer 150 is formed of a photosensitive material, the insulating layer 150 may be formed by an etching method using a photoresist or the like. However, when the insulating layer 150 is formed of a non-photosensitive material, the insulating layer 150 may be physically cut out and polished or drilled or may be drilled using a laser or the like.

Figure 3:
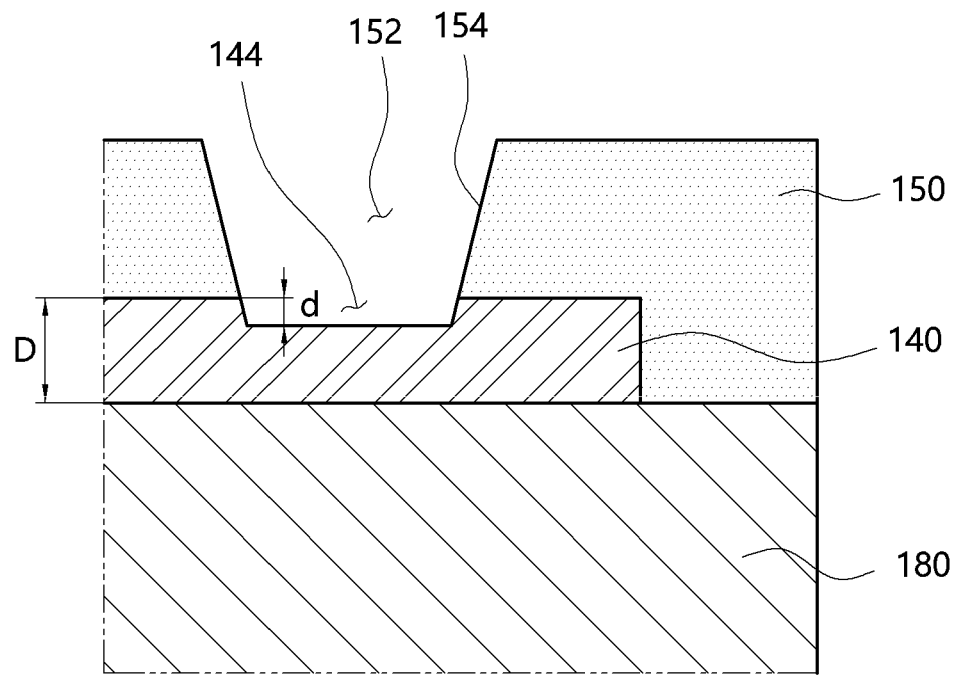
FIG. 3 is a cross-sectional view illustrating a portion of the semiconductor chip package according to the first embodiment of the present disclosure that is etched by laser etching.

In this case, as illustrated in FIG. 3, in the case of drilling using a laser, a side surface 154 of a drilled portion 152 may be formed to be inclined such that a width of the drilled portion 152 becomes narrower inward.

Accordingly, the insulating layer 150 made of a non-photosensitive material is etched by being irradiated with a laser to expose the wiring pattern 140 which is an object to be exposed.

Here, the object to be exposed refers to an object exposed to the outside through etching, polishing, or drilling and may be the wiring pattern 140, the chip 110, or the like that is buried in the insulating layer 150 or the mold layer 180. In addition, other components buried in the insulating layer 150 or the mold layer 180 may also be the object to be exposed that needs to be exposed through drilling, polishing, or the like as necessary.

In addition, in the case of drilling using a laser, a portion of the wiring pattern 140, which is the object to be exposed that needs to be exposed, may also be drilled to form an over-etched region 144.

The over-etched region 144 is formed in the object to be exposed because, when drilling is performed with the laser, residue may remain on a surface of the object to be exposed if drilling is performed up to an interface region of the object to be exposed. Thus, when the over-etched region 144 is formed by etching slightly further than the interface of the object to be exposed, the concern of remaining residue may be excluded.

A range (a depth d) in which the over-etched region 144 thus formed is over-etched may be between 0.01% and 30% of a thickness D of the object to be exposed. Of course, such a range may be adjusted as necessary. In the present embodiment, the depth at which the over-etched region 144 is over-etched is illustrated as being 2 to 3 µm, but the present disclosure is not limited thereto.

Hereinafter, a semiconductor package 200 according to a second embodiment of the present disclosure will be described.

Figure 4:
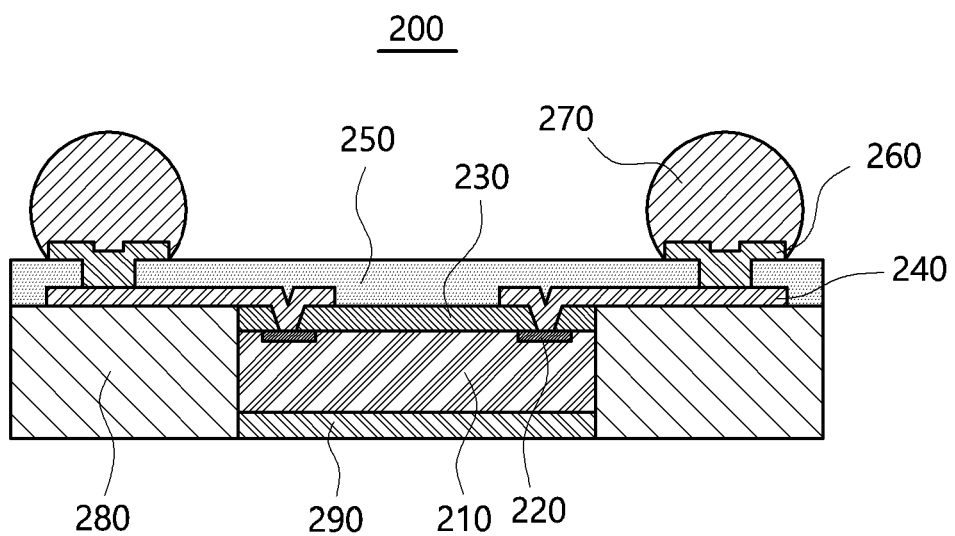
FIG. 4 is a cross-sectional view illustrating a semiconductor chip package according to a second embodiment of the present disclosure.

As illustrated in FIG. 4, the semiconductor package 200 according to the present embodiment may include a chip 210, a buffer layer 230, wiring patterns 240, an insulating layer 250, an external pad 260, an external connection terminal 270, a mold layer 280, and a metal heat dissipating pad 290.

The chip 210, the buffer layer 230, the wiring patterns 240, the insulating layer 250, the external pad 260, and the external connection terminal 270 are substantially identical or similar to the chip 110, the buffer layer 130, the wiring patterns 140, the insulating layer 150, the external pad 160, and the external connection terminal 170 of the first embodiment described above, and thus detailed descriptions thereof will be omitted.

Meanwhile, the above-described mold layer 180 according to the first embodiment is formed to surround the other surface and the side surface of the chip 110 and the side surface of the buffer layer 130, but the mold layer 280 of the present embodiment may have a portion corresponding to the other surface of the chip 210 that is open.

In addition, the metal heat dissipating pad 290 may be provided to be in contact with the other surface of the chip 210. Further, the metal heat dissipating pad 290 may be formed to be exposed to an outside of the other surface of the mold layer 280.

As a result, by providing the metal heat dissipating pad 290, heat generated from the chip 110 may be conducted to the metal heat dissipating pad 290 and dissipated to the outside.

The above-described metal heat dissipating pad 290 may be formed of a material having excellent thermal conductivity, such as aluminum, copper, stainless steel, or the like, and any material with excellent thermal conductivity may be applicable to the metal heat dissipating pad 290 even though the material is not necessarily metal.

Hereinafter, a semiconductor package 300 according to a third embodiment of the present disclosure will be described.

Figure 5:
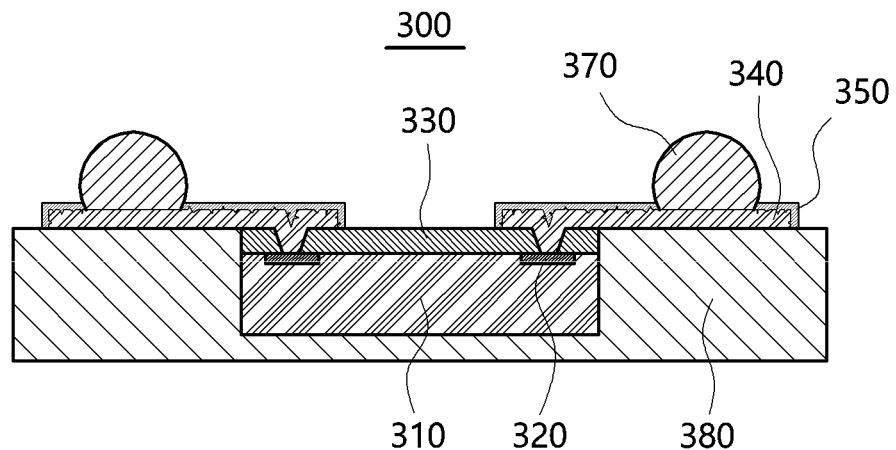
FIG. 5 is a cross-sectional view illustrating a semiconductor chip package according to a third embodiment of the present disclosure.

As illustrated in FIG. 5, the semiconductor package 300 according to the present embodiment may include a chip 310, a buffer layer 330, wiring patterns 340, an external connection terminal 370, and a mold layer 380.

The chip 310, the buffer layer 330, and the mold layer 380 are substantially similar or identical to the chip 110, the buffer layer 130, and the mold layer 180 of the first embodiment described above, and thus detailed descriptions thereof will be omitted.

Meanwhile, in the semiconductor package 100 of the first embodiment described above, the insulating layer 150 is provided to cover the wiring pattern 140, but in the semiconductor package 300 of the present embodiment, instead of the insulating layer 150, an oxide passivation layer 350 may be formed on a surface of the wiring pattern 340.

Since the oxide passivation layer 350 is formed on the surface of the wiring pattern 340, the wiring pattern 340 may be protected from being corroded or the like even when the insulating layer 150 is not formed.

In addition, since the insulating layer 150 is not formed, the external pad 160 is not necessarily required, and it is also possible that the external connection terminal 370 is directly formed on the wiring pattern 340.

Further, since the oxide passivation layer 350 is formed on the surface of the wiring pattern 340, a separate passivation layer for protecting the surface of the wiring pattern 340 does not need to be formed, and thus the wiring pattern may have a smaller thickness.

Further, in order to form the robust oxide passivation layer 350, a roughening process for increasing surface roughness of the wiring pattern 340 may be performed before the oxide passivation layer 350 is formed.

Hereinafter, a semiconductor package 400 according to a fourth embodiment of the present disclosure will be described.

Figure 6:
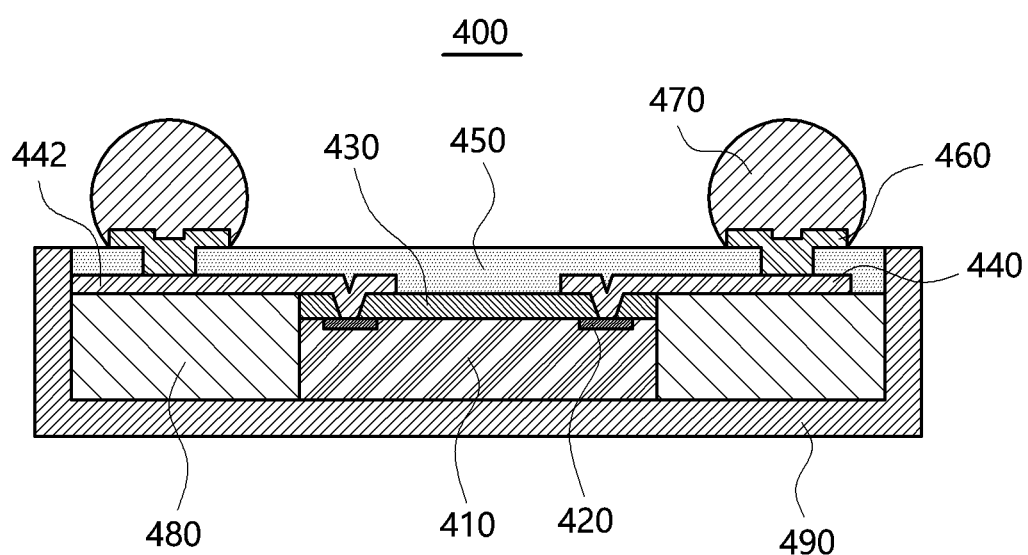
FIG. 6 is a cross-sectional view illustrating a semiconductor chip package according to a fourth embodiment of the present disclosure.

As illustrated in FIG. 6, the semiconductor package 400 according to the present embodiment may include a chip 410, a buffer layer 430, wiring patterns 440, an insulating layer 450, an external pad 460, an external connection terminal 470, a mold layer 480, and a shield layer 490.

Here, the chip 410, the buffer layer 430, the insulating layer 450, the external pad 460, and the external connection terminal 470 are substantially similar or identical to the chip 110, the buffer layer 130, the insulating layer 150, the external pad 160, and the external connection terminal 170 of the first embodiment described above, and thus detailed descriptions thereof will be omitted.

Meanwhile, the above-described mold layer 180 according to the first embodiment is formed to surround the other surface and the side surface of the chip 110 and the side surface of the buffer layer 130, but the mold layer 480 of the present embodiment may be formed to have a portion corresponding to the other surface of the chip 410 that is open and to surround a side surface of each of the chip 410 and the buffer layer 430. In addition, the other surface of the mold layer 480 may be formed to be coplanar with the other surface of the chip 410.

In addition, the shield layer 490 may be formed of a metal material having thermal conductivity, electrical conductivity, and electromagnetic interference (EMI) shielding properties and may be formed to surround the other surface and a side surface of the mold layer 480 and a side surface of the insulating layer 450. At this point, the shield layer 490 may be provided to be in contact with the other surface of the chip 410.

In addition, a wiring pattern 442, among the plurality of wiring patterns 440 provided in the chip 410, in charge of grounding may extend longer to a lateral surface and may be electrically connected to the shield layer 490 by being in contact therewith and thus achieve grounding.

Accordingly, the shield layer 490 may perform a role of a heat sink configured to dissipate heat generated from the chip 410 to the outside and may perform a function of shielding EMI generated from the chip 410 or introduced from the outside as well as a grounding function.

Further, the outside of the semiconductor package 400 may be finished with a metal material so that the semiconductor package 400 may be more effectively protected from physical impact and chemical impact.

The shield layer 490 may be formed of a metal material such as aluminum, copper, stainless steel, and the like having excellent heat dissipation properties, but the present disclosure is not limited thereto, and any material having excellent thermal conductivity and EMI shielding properties may be applicable to the shield layer 490.

Hereinafter, a semiconductor package 500 according to a fifth embodiment of the present disclosure will be described.

Figure 7:
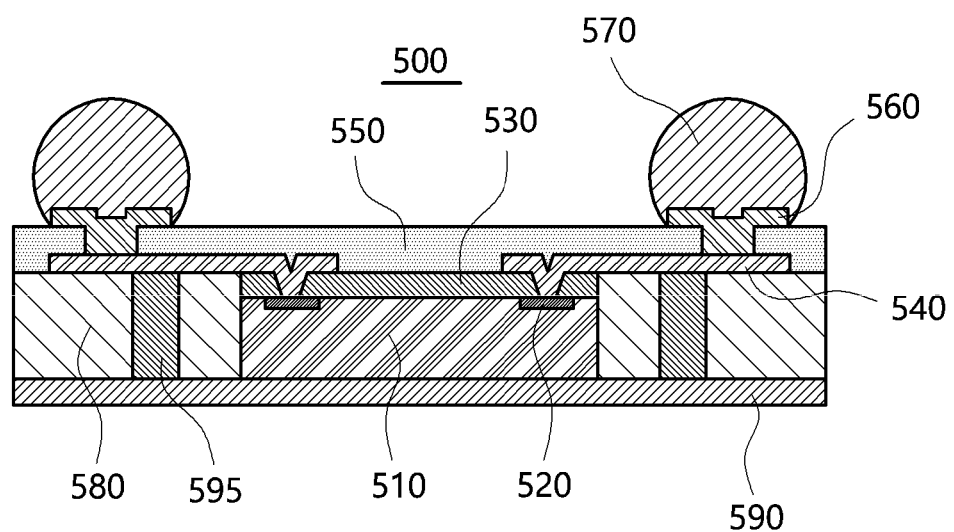
FIG. 7 is a cross-sectional view illustrating a semiconductor chip package according to a fifth embodiment of the present disclosure.

As illustrated in FIG. 7, the semiconductor package 500 according to the present embodiment may include a chip 510, a buffer layer 530, wiring patterns 540, an insulating layer 550, an external pad 560, an external connection terminal 570, a mold layer 580, an embedded ground portion 595, and a metal shielding layer 590.

The chip 510, the buffer layer 530, the wiring patterns 540, the insulating layer 550, the external pad 560, and the external connection terminal 570 are substantially identical or similar to the chip 110, the buffer layer 130, the wiring patterns 140, the insulating layer 150, the external pad 160, and the external connection terminal 170 of the first embodiment described above, and thus detailed descriptions thereof will be omitted.

Meanwhile, the above-described mold layer 180 according to the first embodiment is formed to surround the other surface and the side surface of the chip 110 and the side surface of the buffer layer 130, but the mold layer 580 of the present embodiment may be formed to have a portion corresponding to the other surface of the chip 510 that is open and to surround a side surface of each of the chip 510 and the buffer layer 530. In addition, the other surface of the mold layer 580 may be formed to be coplanar with the other surface of the chip 510.

The embedded ground portion 595 may be formed inside the mold layer 580.

The embedded ground portion 595 may be formed inside the mold layer 580, and one side of the embedded ground portion 595 may be electrically connected to the wiring pattern 540 in charge of grounding among the plurality of wiring patterns 540 and the other side thereof may extend toward the other surface of the mold layer 580.

The embedded ground portion 595 may be formed as one embedded ground portion or may be formed as a plurality.

Meanwhile, the other end of the embedded ground portion 595 described above may extend toward the other surface of the mold layer 580 to be coplanar with the other surface of the mold layer 580.

In addition, the metal shielding layer 590 may be provided. The metal shielding layer 590 may be formed to be in contact with the other surface of the chip 510 and the other end of the embedded ground portion 595.

Accordingly, the metal shielding layer 590 may perform a role of a heat sink configured to dissipate heat generated from the chip 510 to the outside and may perform a function of shielding EMI generated from the chip 510 and EMI introduced from the outside as well as a grounding function.

In addition, a package-on-package (POP) structure may be formed by being stacked with other semiconductor packages through the metal shielding layer.

Hereinafter, a method of manufacturing the above-described semiconductor package 100 according to the first embodiment of the present disclosure will be described with reference to FIGS. 8 to 18.

Figure 8:
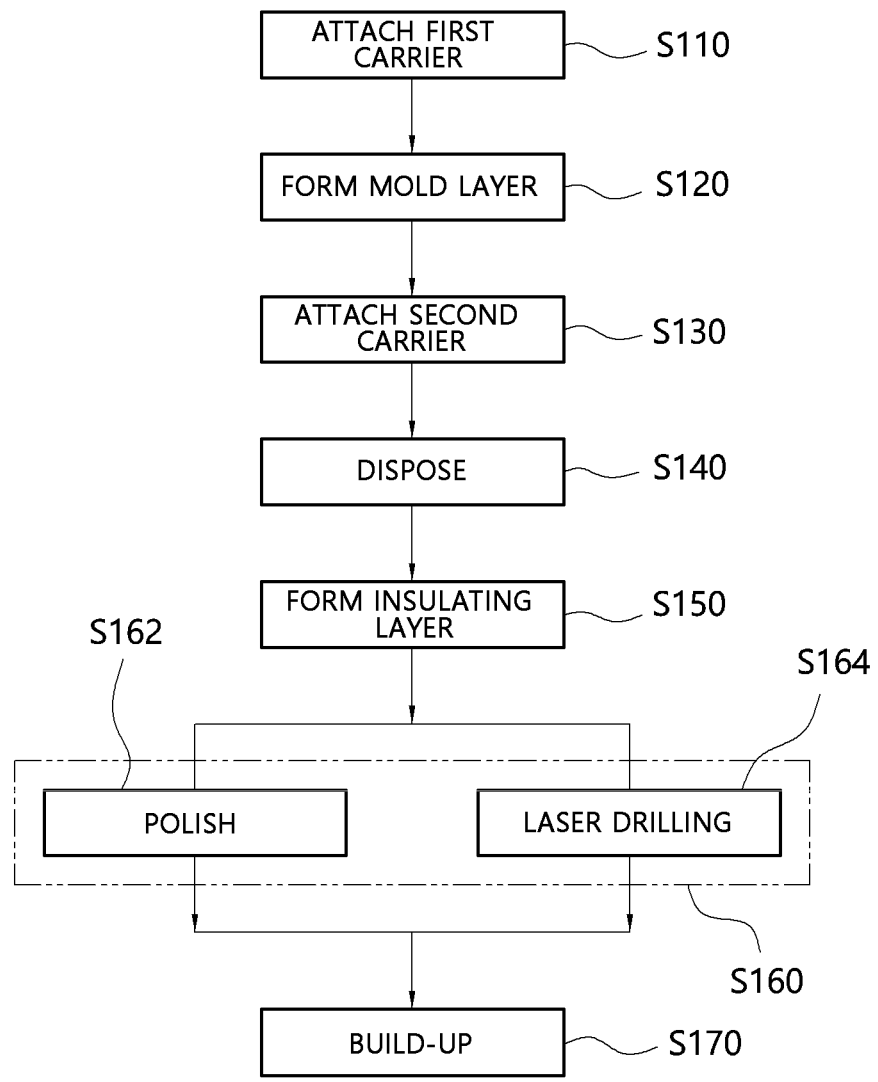
FIG. 8 is a flow chart illustrating one example of a method of manufacturing the semiconductor package according to the first embodiment of the present disclosure.

As illustrated in FIG. 8, the method of manufacturing the semiconductor package according to the present embodiment may include a first carrier attaching operation (S110), a mold layer forming operation (S120), a second carrier attaching operation (S130), a disposing operation (S140), an insulating layer forming operation (S150), an exposing operation (S160), and a build-up operation (S170).

Figure 9A:
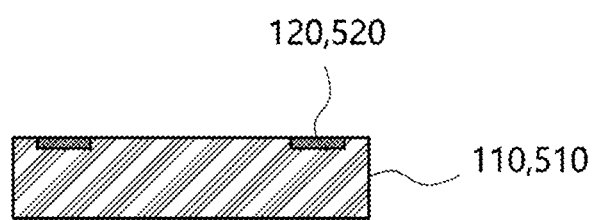
FIGS. 9A and 9B are cross-sectional views illustrating a state in which a buffer layer is formed on one surface of a chip in a disposing operation of FIG. 8.
Figure 9B:
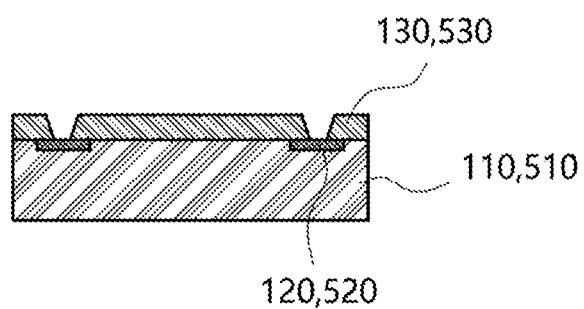
Figure 10A:
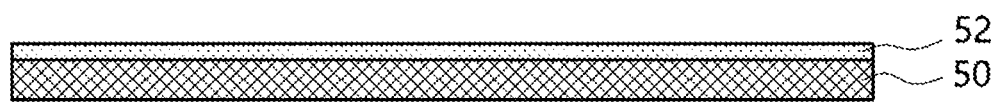
FIGS. 10A and 10B are cross-sectional views illustrating a state of a first carrier attaching operation of FIG. 8.
Figure 10B:
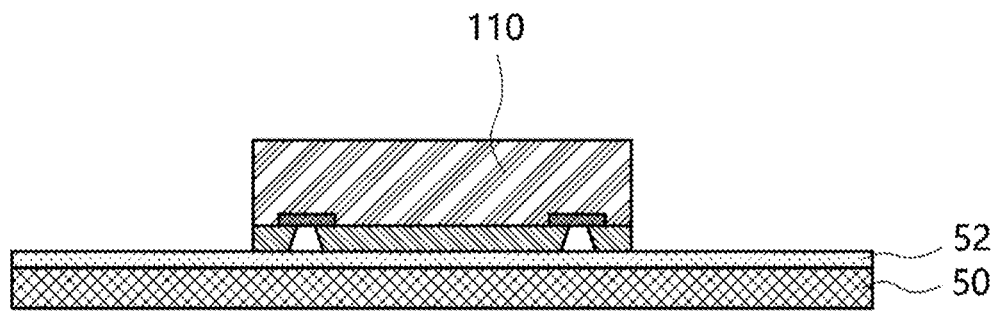

The first carrier attaching operation (S110) is an operation of forming a buffer layer 130 on one surface of a chip 110, as illustrated in FIGS. 9A and 9B, and turning the chip 110 over such that the buffer layer 130 faces downward and then attaching the buffer layer 130 on a first carrier 50 as illustrated in FIGS. 10A and 10B.

Here, after the buffer layer 130 is formed, a back-grinding process may be performed on the other surface of the chip 110.

As illustrated in FIG. 10A, the first carrier 50 may be formed as a flat plate, and an adhesive surface 52, to which a structure such as the chip 110 may be temporarily attached, may be formed on the first carrier 50.

In the present operation, as illustrated in FIG. 10B, the chip 110 may be disposed to be in contact with an upper surface of the first carrier 50 in a state in which the buffer layer 130 faces the first carrier 50. The buffer layer 130 may also be adhered to the adhesive surface 52 of the first carrier 50 so that the position thereof may be temporarily fixed.

Figure 11:
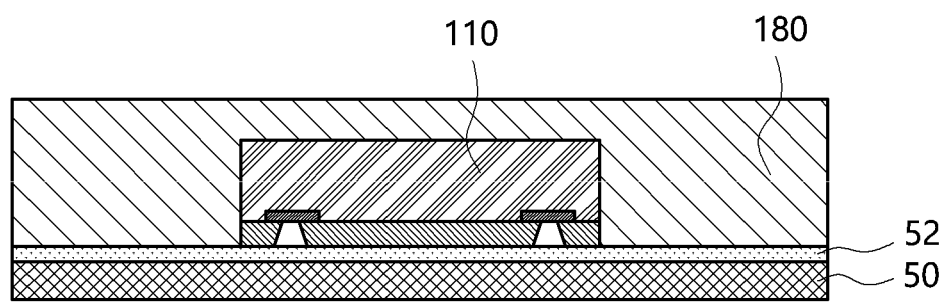
FIG. 11 is a cross-sectional view illustrating a state of a mold layer forming operation of FIG. 8.

As illustrated in FIG. 11, the mold layer forming operation (S120) is an operation of forming a mold layer 180 on an upper side of the chip 110 disposed above the first carrier 50. As the mold layer forming operation (S120) is performed, the other surface of the chip 110 may be buried in the mold layer 180.

Figure 12:
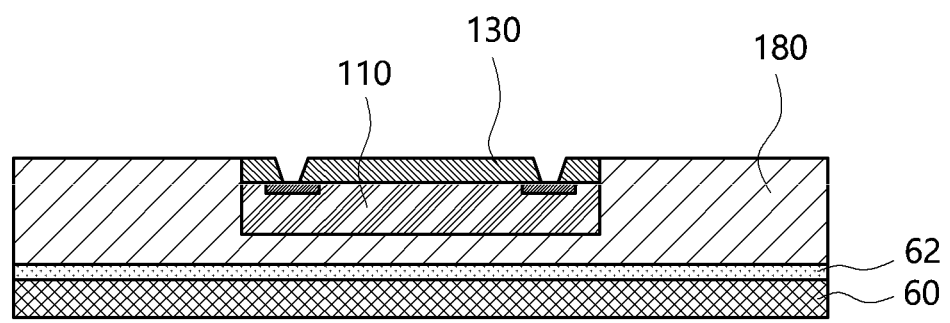
FIG. 12 is a cross-sectional view illustrating a state of a second carrier attaching operation of FIG. 8.

As illustrated in FIG. 12, the second carrier attaching operation (S130) is an operation of turning over the chip 110 on which the mold layer 180 is formed and attaching the other surface of the chip 110 to a second carrier 60. At this point, the first carrier 50 may be removed, and the second carrier 60 may be disposed on the other surface of the mold layer 180 to support the other surface of the mold layer 180.

The second carrier 60 may also be formed as a flat plate, and an adhesive surface 62, to which a structure such as the mold layer 180 may be temporarily attached, may be formed on an upper surface of the second carrier 60.

Figure 13:
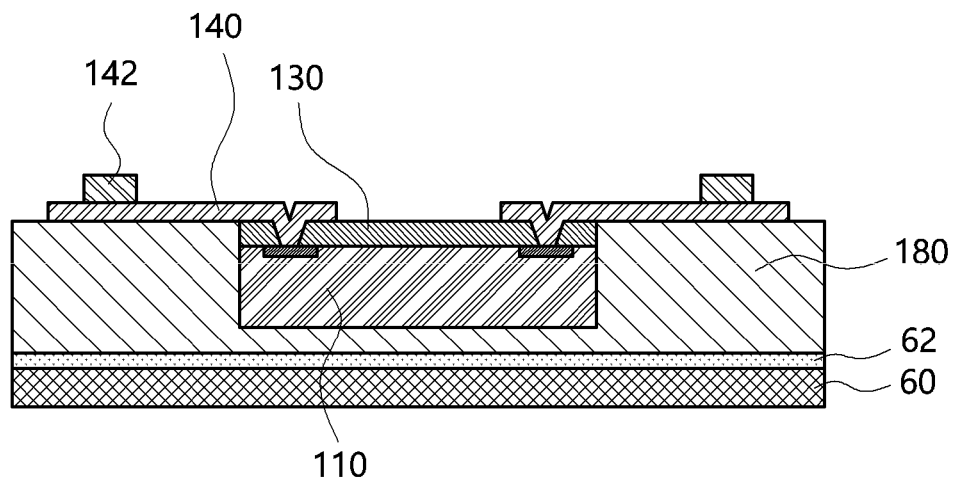
FIG. 13 is a cross-sectional view illustrating a state in which a conductive via is formed in the disposing operation FIG. 8.

In addition, the disposing operation (S140) may be performed as illustrated in FIG. 13. In the disposing operation (S140), one or more wiring patterns 140, which are electrically connected to the contact pad 120 of the chip 110 and extend to an outside of the chip 110, may be disposed on one surface of the buffer layer 130.

Here, a conductive via 142 may be formed on one surface of the wiring pattern 140. The conductive via 142 may be formed so that an external pad to be described below and the wiring pattern 140 are electrically connected to each other. Of course, the conductive via 142 may be formed or may not be formed as necessary.

Figure 14:
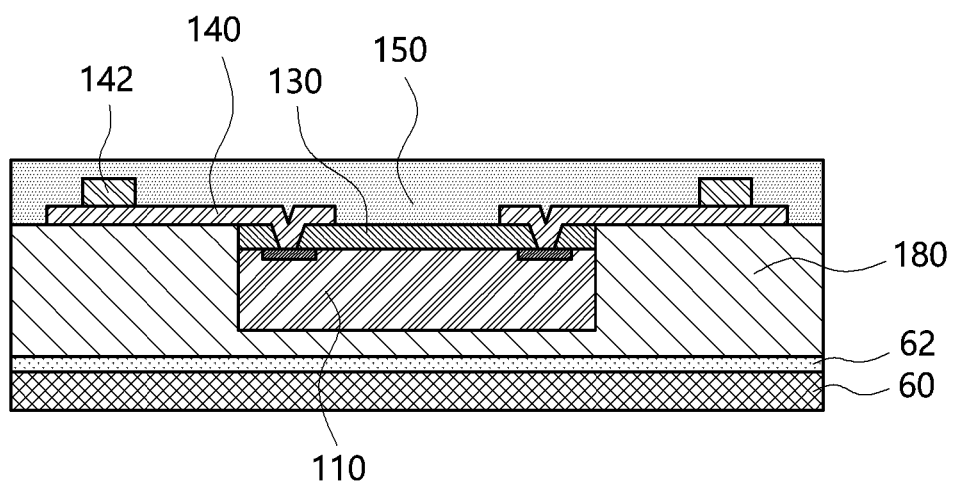
FIG. 14 is a cross-sectional view illustrating a state of an insulating layer forming operation of FIG. 8.

In addition, the insulating layer forming operation (S150) is an operation of forming an insulating layer 150 on one side of the wiring pattern 140 as illustrated in FIG. 14.

Figure 15:
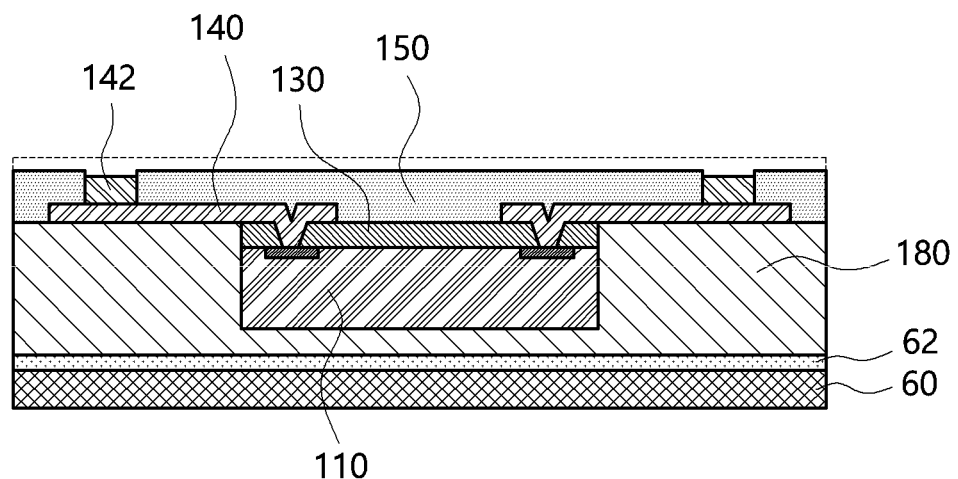
FIG. 15 is a cross-sectional view illustrating a polished state in an exposing operation of FIG. 8.

After the insulating layer 150 is formed, the exposing operation (S160) may be performed as illustrated in FIG. 15. The exposing operation (S160) is an operation of removing a portion of the insulating layer 150 so that a portion of the wiring pattern 140 buried in the insulating layer 150 or a portion of the conductive via 142 is exposed. As illustrated in FIG. 15, the exposing operation (S160) may be performed through a mechanical polishing or etching operation (S162) so that the wiring pattern 140 or the conductive via 142 is exposed.

Meanwhile, the exposing operation (S160) may be performed through a drilling operation using a laser (S164).

Figure 16:
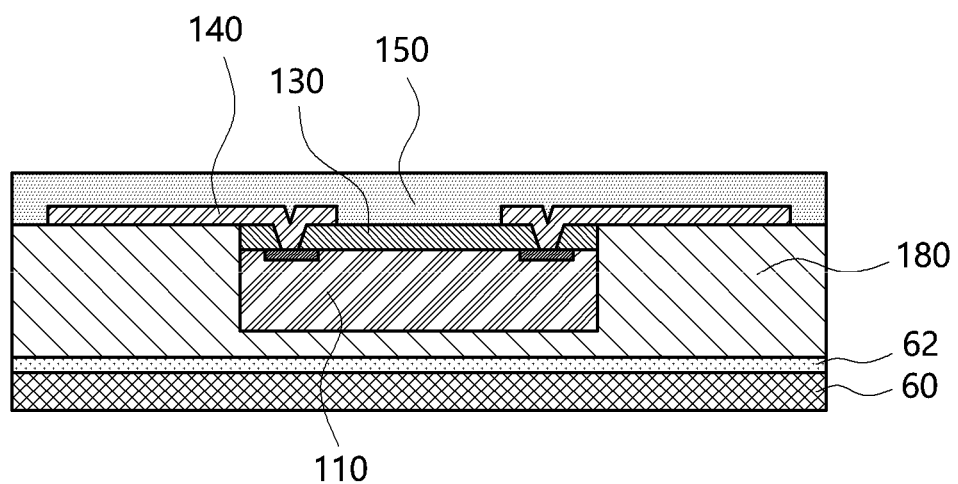
FIG. 16 is a cross-sectional view illustrating a state in which an insulating layer is formed in a state in which the conductive via is not formed in the insulating layer forming operation of FIG. 8.
Figure 17:
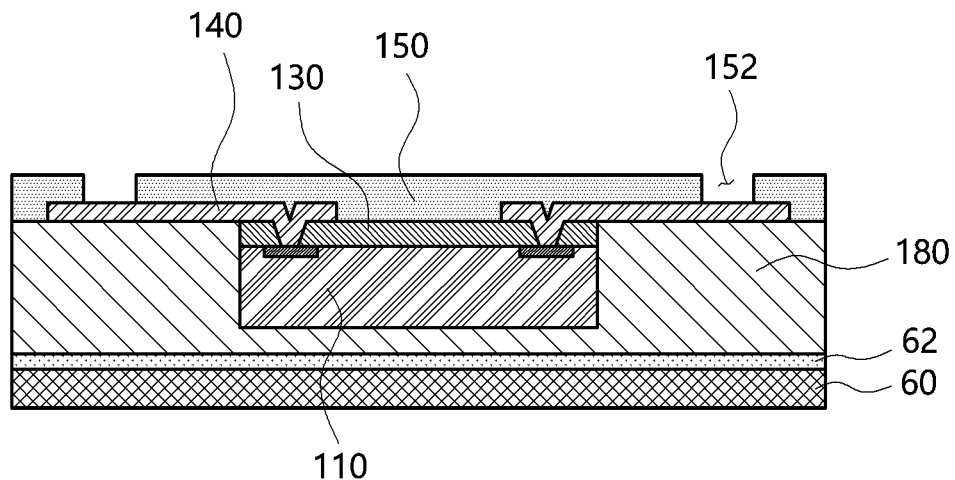
FIG. 17 is a cross-sectional view illustrating a state in which laser drilling is performed in the exposing operation of FIG. 8.

That is, as illustrated in FIG. 16, after the insulating layer forming operation (S150) of forming the insulating layer 150 on one side of the wiring pattern 140 is performed, a drilled portion 152 exposing the wiring pattern 140 may be formed by drilling a portion of the insulating layer 150 using a laser as illustrated in FIG. 17. In general, the use of a laser allows more freedom in drilling depth compared to mechanical polishing, and thus it may not be necessary to form a separate conductive via 142. Of course, the present disclosure is not limited thereto, and laser drilling may be performed while forming the conductive via 142. In addition, deep drilling is enabled by using the laser so that the insulating layer 150 may be formed to be thicker, and accordingly, a portion protecting the chip 110 may be thicker, thereby improving durability and reliability.

Figure 18:
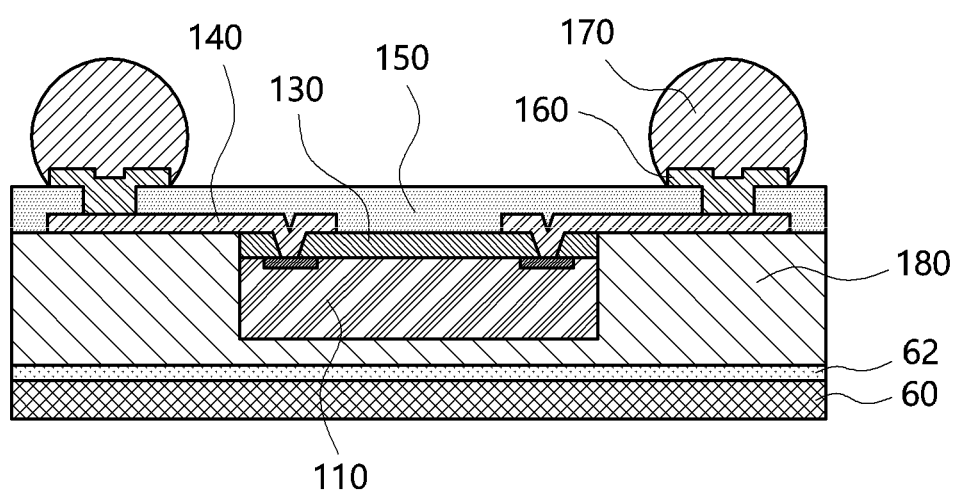
FIG. 18 is a cross-sectional view illustrating a state of a build-up operation of FIG. 8.

After the exposing operation (S160), as illustrated in FIG. 18, the build-up operation (S170) of disposing an external pad 160 and an external connection terminal 170 on the exposed wiring pattern 140 may be performed.

Hereinafter, a method of manufacturing the above-described semiconductor package 500 according to the fifth embodiment of the present disclosure will be described with reference to FIGS. 19 to 24.

Figure 19:
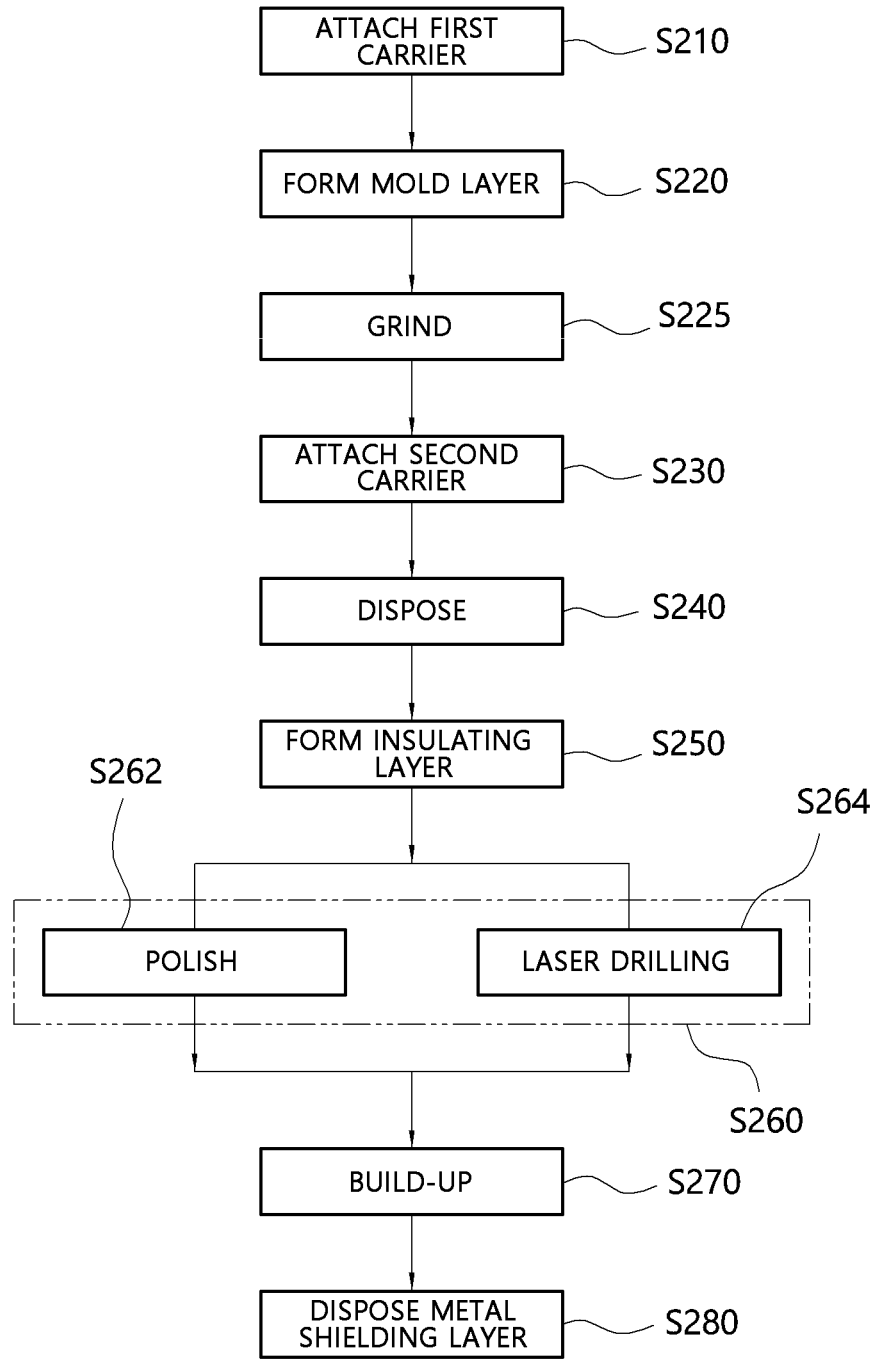
FIG. 19 is a flow chart illustrating one example of a method of manufacturing the semiconductor package according to the fifth embodiment of the present disclosure.

As illustrated in FIG. 19, the method of manufacturing the semiconductor package according to the present embodiment may include a first carrier attaching operation (S210), a mold layer forming operation (S220), a grinding operation (S225), a second carrier attaching operation (S230), a disposing operation (S240), an insulating layer forming operation (S250), an exposing operation (S260), a build-up operation (S270), and a metal shielding layer disposing operation (S280).

Figure 20A:
FIGS. 20A and 20B are cross-sectional views illustrating a state of a first carrier attaching operation of FIG. 19.
Figure 20B:
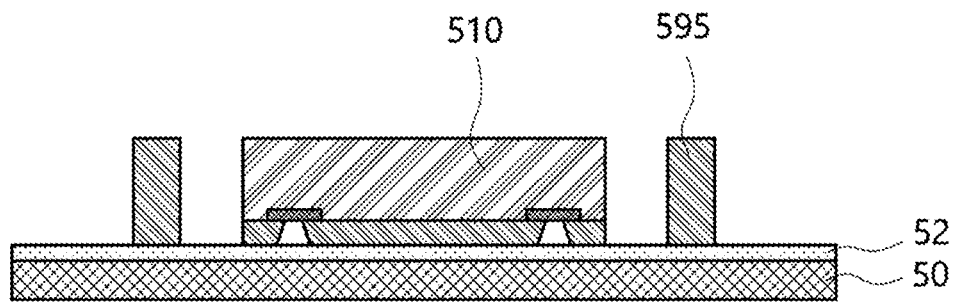

The first carrier attaching operation (S210) is an operation of forming a buffer layer 530 on one surface of a chip 510, as illustrated in FIGS. 9A and 9B, and turning the chip 510 over such that the buffer layer 530 faces downward and then attaching the buffer layer 530 on a first carrier 50 as illustrated in FIGS. 20A and 20B.

Here, after the buffer layer 530 is formed, a back-grinding process may be performed on the other surface of the chip 510.

As illustrated in FIG. 20A, the first carrier 50 may be formed as a flat plate, and an adhesive surface 52, to which a structure such as the chip 510 may be temporarily attached, may be formed on the first carrier 50.

In the first carrier attaching operation (S210), an embedded ground portion 595 may be formed on an upper side surface of the first carrier 50 as illustrated in FIG. 20A. The first carrier 50 may be formed as a flat plate, and an adhesive surface 52, to which a structure such as the embedded ground portion 595 may be temporarily attached, may be formed on an upper surface of the first carrier 50. The embedded ground portion 595 may be formed on the upper side surface of the first carrier 50.

Further, as illustrated in FIG. 20B, the chip 510 may be disposed to be in contact with the adhesive surface 52 of the first carrier 50 in a state in which the buffer layer 530 faces the first carrier 50. The buffer layer 530 may also be adhered to the adhesive surface 52 of the first carrier 50 so that the position thereof may be temporarily fixed.

Figure 21:
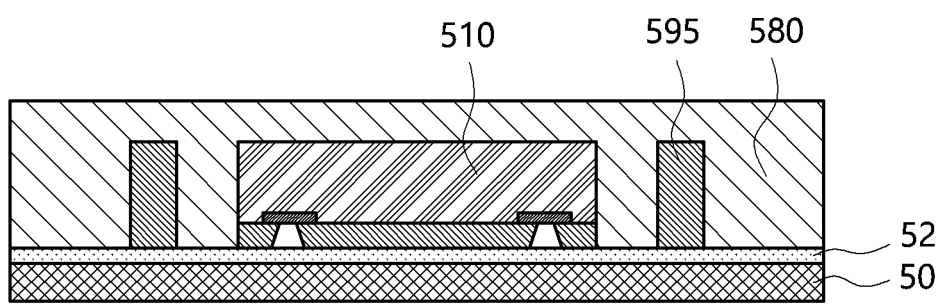
FIG. 21 is a cross-sectional view illustrating a state of a mold layer forming operation of FIG. 19.

As illustrated in FIG. 21, the mold layer forming operation (S220) is an operation of forming a mold layer 580 on an upper side and a side surface of each of the chip 510 and the embedded ground portion 595 that are disposed above the first carrier 50. While the mold layer forming operation (S220) is being performed, the other surface of each of the chip 510 and the embedded ground portion 595 may be buried in the mold layer 580.

Figure 22:
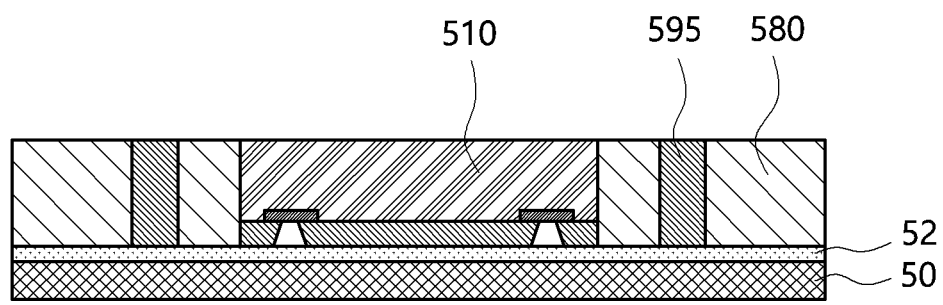
FIG. 22 is a cross-sectional view illustrating a state of a grinding operation of FIG. 19.

In addition, the grinding operation (S225) may be performed. In the grinding operation (S225), as illustrated in FIG. 22, the other surface of the mold layer 580 may be ground and polished so that the other surface of the chip 510 or the other end of the embedded ground portion 595 is exposed.

Here, in the grinding operation (S225) of the present embodiment, the other surface of the mold layer 580 may be polished such that the other surface of the mold layer 580 is coplanar with the other surface of the chip 510 and the other end of the embedded ground portion 595.

Figure 23:
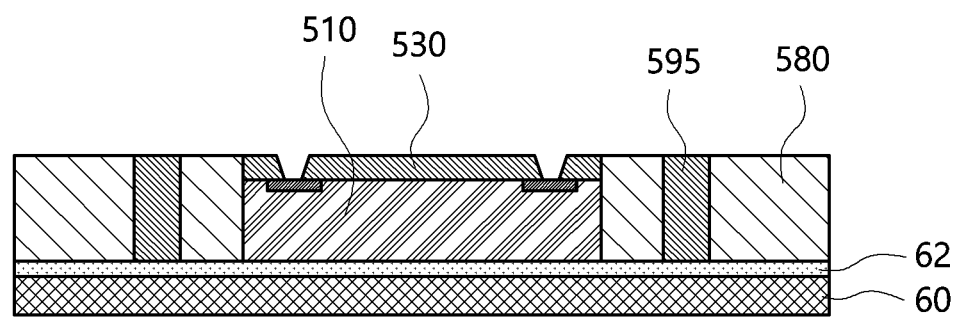
FIG. 23 is a cross-sectional view illustrating a second carrier attaching operation of FIG. 19.

As illustrated in FIG. 23, the second carrier attaching operation (S230) is an operation of turning over the chip 510 and the embedded ground portion 595, on which the mold layer 580 is formed, and attaching the other surface of each of the chip 510 and the embedded ground portion 595 to a second carrier 60. At this point, the first carrier 50 may be removed, and the second carrier 60 may be disposed on the other surface of the mold layer 580 to support the other surface of the mold layer 580 and the other end of the embedded ground portion 595.

The second carrier 60 may also be formed as a flat plate, and an adhesive surface 62, to which a structure such as the mold layer 580 may be temporarily attached, may be formed on an upper surface of the second carrier 60.

In addition, the insulating layer forming operation (S250), the exposing operation (S260), and the build-up operation (S270) may be performed. The insulating layer forming operation (S250), the exposing operation (S260), and the build-up operation (S270) are substantially similar to the insulating layer forming operation (S150), the exposing operation (S160), and the build-up operation (S170), which are described above in the manufacturing method of the first embodiment, and thus detailed descriptions thereof will be omitted. An insulating layer 550, an external pad 560, and an external connection terminal 570 may be disposed through the insulating layer forming operation (S250), the exposing operation (S260), and the build-up operation (S270).

Figure 24:
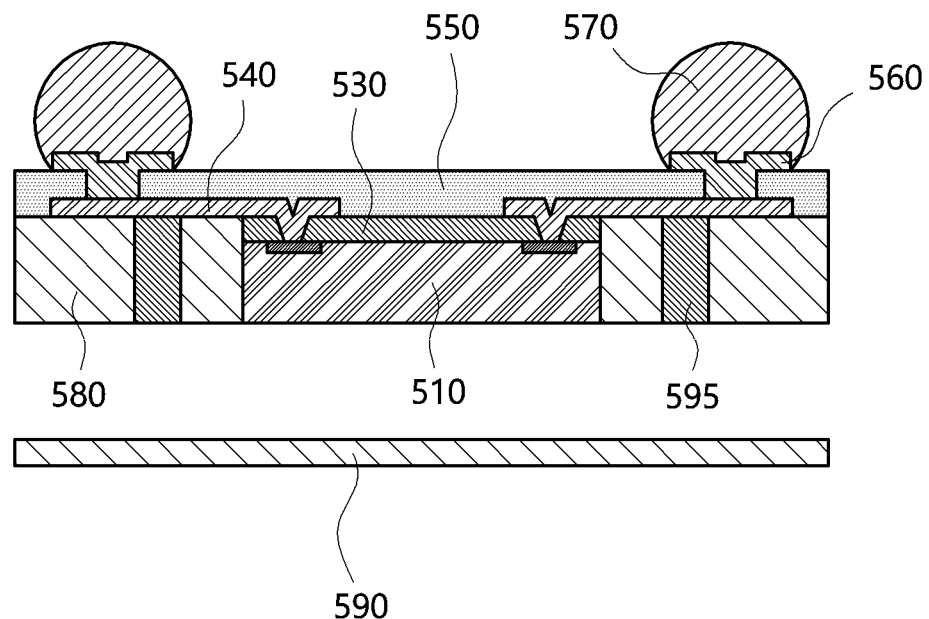
FIG. 24 is a cross-sectional view illustrating a state of a build-up operation and a metal shielding layer disposing operation of FIG. 19.

In addition, the metal shielding layer disposing operation (S280) is performed to provide a metal shielding layer 590 on the other surface of the mold layer 580, on which the grinding operation is performed, as illustrated in FIG. 24. At this point, since the other surface of the mold layer 580 is coplanar with the other surface of the chip 510 and the other end of the embedded ground portion 595, the metal shielding layer 590 may also be planar.

Here, the metal shielding layer 590 may be provided to be in contact with the other surface of each of the chip 510 and the mold layer 580 and the other end of the embedded ground portion 595. Thus, heat may be rapidly discharged since the metal shielding layer 590 is in contact with the chip 510, and a ground line may be formed since the metal shielding layer 590 is in contact with the other end of the embedded ground portion 595.

Hereinafter, a semiconductor package 600 according to a sixth embodiment of the present disclosure will be described.

Figure 25:
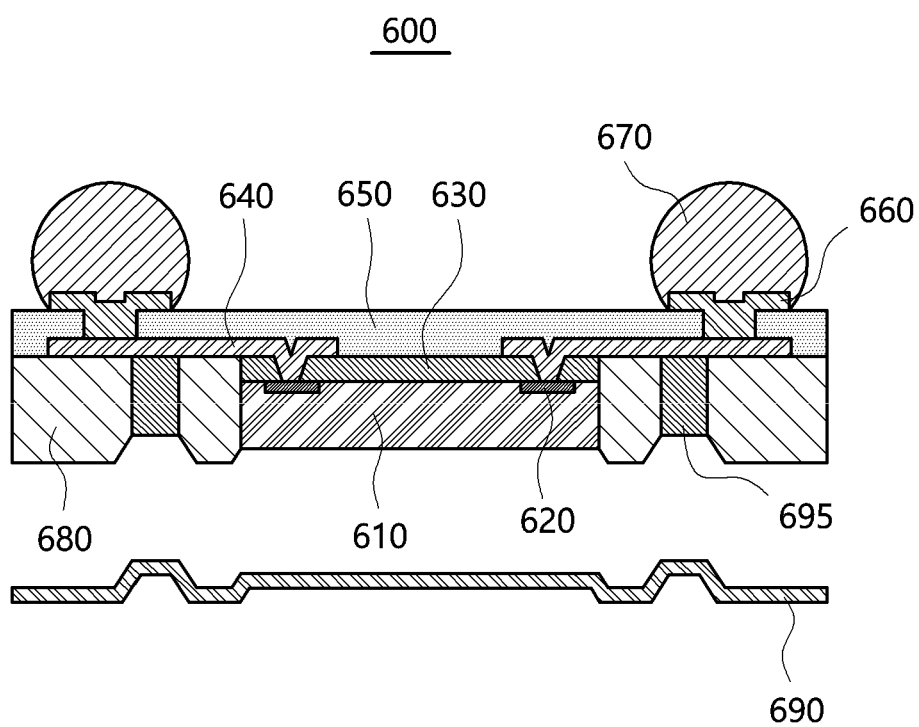
FIGS. 25 and 26 are cross-sectional views illustrating a semiconductor chip package according to a sixth embodiment of the present disclosure.
Figure 26:
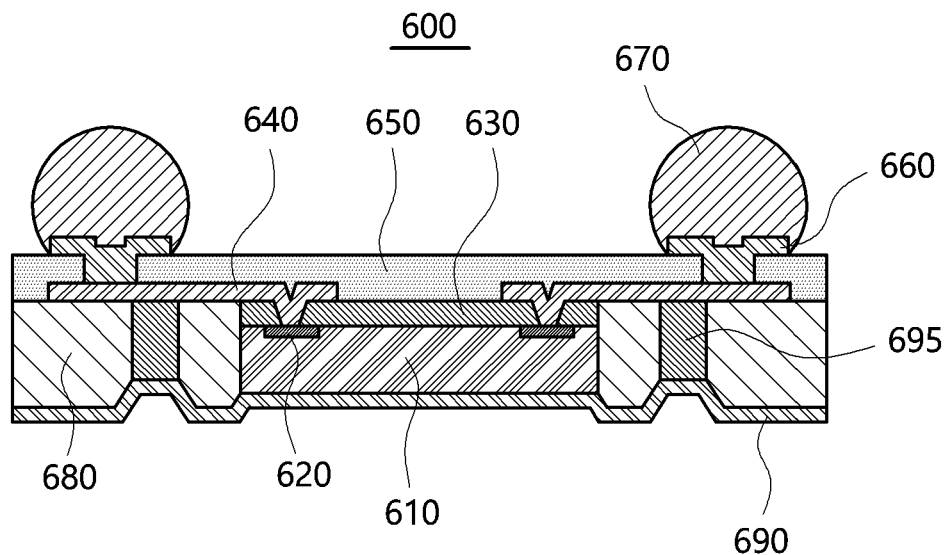

As illustrated in FIGS. 25 and 26, the semiconductor package 600 according to the present embodiment may include a chip 610, a buffer layer 630, wiring patterns 640, an insulating layer 650, an external pad 660, an external connection terminal 670, a mold layer 680, an embedded ground portion 695, and a metal shielding layer 690, and these components may be substantially similar to the chip 510, the buffer layer 530, the wiring patterns 540, the insulating layer 550, the external pad 560, the external connection terminal 570, the mold layer 580, the embedded ground portion 595, and the metal shielding layer 590 of the fifth embodiment described above.

However, in the above-described embodiment, the other surface of the mold layer 580, the other surface of the chip 510, and the other end of the embedded ground portion 595 are polished in the grinding operation (S225) to be coplanar with each other, and the metal shielding layer 590 is also planar, but according to the present embodiment, the other surface of the mold layer 680, the other surface of the chip 610, and the other end of the embedded ground portion 695 are not coplanar with each other, and the metal shielding layer 690 is also not planar and may be formed in a shape that is bent several times.

In the above-described embodiment, the other surface of the mold layer 580, the other surface of the chip, and the other end of the embedded ground portion 595 are ground to be coplanar with each other, but in the present embodiment, as illustrated in FIG. 25, portions of the other surface of the mold layer 680 corresponding to the chip and the embedded ground portion 695 may be drilled so that the other surface of the chip 610 and the other end of the embedded ground portion 695 are exposed.

In this case, a laser may be used as a drilling means. However, the present disclosure is not limited thereto, and drilling may be performed using other known drilling means.

Here, the drilled portion is formed in a tapered shape such that a width thereof is gradually increased in a direction toward the other surface of the mold layer 680 and gradually decreased in a direction toward an inside of the mold layer 680.

Accordingly, the other surface of the mold layer 680, the other surface of the chip 610, and the other surface of the embedded ground portion 695 may not be coplanar with each other and may form steps with different heights, and the other surface of the chip 610 and the other surface of the embedded ground portion 695 may be located further inward than the other surface of the mold layer 680.

At this point, the other surface of the embedded ground portion 695, which is an object to be exposed by being drilled and exposed by a laser, may be over-etched as described above and may be over-etched in a range (depth) of 2 to 3 μm. Of course, the over-etching may be deeper or thinner than this range.

Accordingly, the metal shielding layer 690 provided on the other surface of the mold layer 680 may have a shape that is bent several times rather than a flat surface. That is, portions corresponding to the other surface of the chip 610 and the other end of the embedded ground portion 695, which are formed so as to form steps with the mold layer 680, may be formed by being bent several times to be in contact with the other surface of the chip 610 and the other end of the embedded ground portion 695. When the metal shielding layer 690 has a shape that is bent several times, a surface area thereof may increase, which may be more advantageous for heat dissipation.

Hereinafter, a semiconductor package 700 according to a seventh embodiment of the present disclosure will be described.

Figure 27:
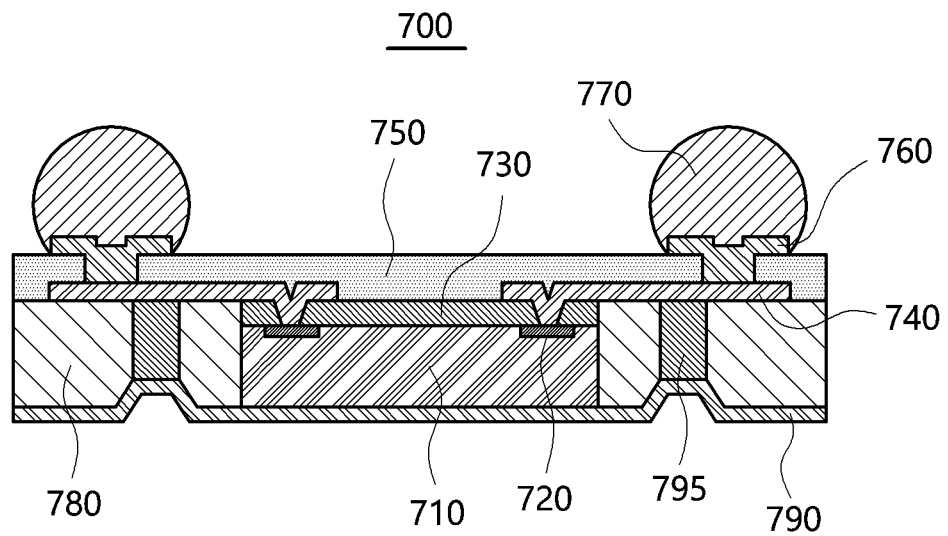
FIG. 27 is a cross-sectional view illustrating a semiconductor chip package according to a seventh embodiment of the present disclosure.

As illustrated in FIG. 27, the semiconductor package 700 according to the present embodiment may include a chip 710, a buffer layer 730, wiring patterns 740, an insulating layer 750, an external pad 760, an external connection terminal 770, a mold layer 780, an embedded ground portion 795, and a metal shielding layer 790, and these components may be substantially similar to the chip 610, the buffer layer 630, the wiring patterns 640, the insulating layer 650, the external pad 660, the external connection terminal 670, the mold layer 680, the embedded ground portion 695, and the metal shielding layer 690 of the sixth embodiment described above.

However, in the above-described embodiment, portions of the other surface of the mold layer 680 corresponding to the chip 610 and the embedded ground portion 695 are drilled, but in the present embodiment, a portion of the other surface of the mold layer 780 corresponding to the chip 710 may be subjected to a polishing operation to be coplanar with the other surface of the mold layer 780, and a portion of the other surface of the mold layer 780 corresponding to the embedded ground portion 795 may be drilled using a laser and thus the drilling may be performed only on the corresponding portion.

That is, when the other end of the embedded ground portion 795 is located inside the mold layer 780 more than the other surface of the chip 710, the other surface of the mold layer 780 may be ground to expose the other surface of the chip 710. At this point, the other surface of the mold layer 780 may be coplanar with the other surface of the chip 710.

Afterward, the portion of the other surface of the mold layer 780 corresponding to the embedded ground portion 795 is drilled by performing a laser drilling process or the like to expose the other end of the embedded ground portion 795.

In addition, the metal shielding layer 790 may be provided on the other surface of the mold layer 780, in which the grinding operation has been performed.

At this point, the other surface of the mold layer 780 and the other surface of the chip 710 may be coplanar with each other, and the other end of the embedded ground portion 795 may be located further inward than the other surface of the mold layer 780.

Accordingly, in the metal shielding layer 790, a portion in contact with the other surface of the mold layer 780 may be coplanar with a portion in contact with the other surface of the chip 710, and a portion in contact with the embedded ground portion 795 may be stepped.

Hereinafter, a semiconductor package 800 according to an eighth embodiment of the present disclosure will be described.

Figure 28:
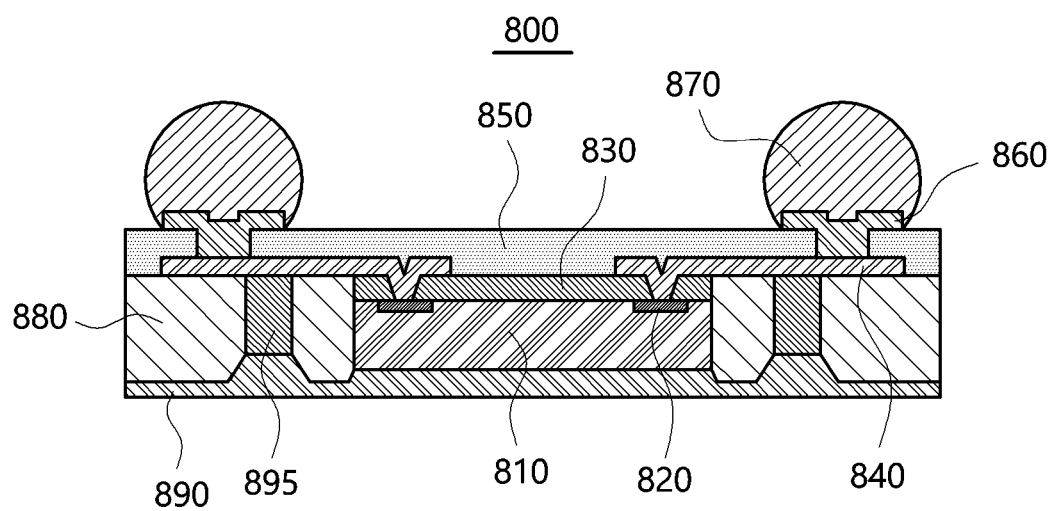
FIG. 28 is a cross-sectional view illustrating a semiconductor chip package according to an eighth embodiment of the present disclosure.

As illustrated in FIG. 28, the semiconductor package 800 according to the present embodiment may include a chip 810, a buffer layer 830, wiring patterns 840, an insulating layer 850, an external pad 860, an external connection terminal 870, a mold layer 880, an embedded ground portion 895, and a metal shielding layer 890, and these components may be substantially similar to the chip 710, the buffer layer 730, the wiring patterns 740, the insulating layer 750, the external pad 760, the external connection terminal 770, the mold layer 780, the embedded ground portion 795, and the metal shielding layer 790 of the seventh embodiment described above.

However, in the above-described embodiment, the metal shielding layer 790 is formed to be bent several times to be in contact with the other surface of the chip 710 or the other end of the embedded ground portion 795, which is formed to be stepped from the other surface of the mold layer 780, but in the present embodiment, a portion of the metal shielding layer 890 corresponding to the other surface of the chip 810 or the other end of the embedded ground portion 895, which is formed to be stepped from the other surface of the mold layer 880, may be formed to be thicker, and the other surface of the metal shielding layer 890 may be formed to be planar.

A semiconductor package and a manufacturing method thereof have the following effects.

First, a mold layer is formed on a circumference of a chip so that it is possible to provide a semiconductor package having a structure resistant to external impact, thermal shock, or the like.

Second, a metal heat dissipating pad, a shield layer of a metal material, or a metal shielding layer is provided on the other surface of the chip or the mold layer to dissipate heat generated during operation so that thermal stability can be improved, and the metal shielding layer capable of shielding electromagnetic interference (EMI) is provided so that operation stability can also be improved.

Third, an insulating layer and the mold layer surrounding one surface and the other surface of the chip are formed of materials having the same physical properties so that distortion due to thermal deformation caused by heat generated from the chip can be minimized.

Fourth, wiring patterns are provided between the insulating layer and the mold layer that are formed of the same physical properties and the same material to provide excellent adhesion between the insulating layer and the mold layer so that a fixing force of the wiring patterns can be improved.

Fifth, the materials of the insulating layer and the mold layer include a non-photosensitive material having excellent adhesion to metal so that a fixing force for fixing the wiring patterns disposed between the insulating layer and the mold layer can be improved.

Sixth, in drilling the insulating layer and the mold layer made of a non-photosensitive material using a laser, an over-etched region, in which a portion of an object to be exposed is also etched, is formed to reduce the possibility of foreign substances remaining on a surface of the object to be exposed so that the possibility of electrical contact failure can be minimized.

It should be noted that advantageous effects of the present disclosure are not limited to the above-described effects, and other effects that are not described herein will be apparent to those skilled in the art from the following descriptions.

The exemplary embodiments of the present disclosure have been examined as described above, and it will be clear to those skilled in the art that the present disclosure will be realized into a different specific form without departing from the spirit or scope of the present disclosure other than the above-described embodiments. Accordingly, the above-described embodiments should be considered in a descriptive sense only and not for purposes of limitation, and the present disclosure is not limited to the above description and may also be changed within the scope of the appended claims and all equivalents falling within the scope.

What is claimed is:

1. A semiconductor package, comprising:
   a chip having a contact pad provided on one surface thereof;
   a buffer layer formed on one surface of the chip;
   a wiring pattern, wherein the wiring pattern include one wiring pattern or a plurality of wiring patterns, and the wiring pattern is disposed on the buffer layer, electrically connected to the contact pad of the chip, and extended to an outside of the chip;
   a mold layer, wherein the mold layer is formed to surround a side surface of the chip, formed to be higher than a corner of one surface of the chip, and formed up to the other surface of the wiring pattern; and
   an insulating layer formed on an outside of the buffer layer so as to cover the buffer layer and wiring pattern;
   wherein the insulating layer or the mold layer are drilled by a laser,
   each of a portion of the insulating layer or a portion of the mold layer, which are drilled by the laser, is formed to have an inclined side surface so that an inner diameter thereof is gradually decreased toward an inside thereof, and
   wherein an object to be exposed by being drilled after being buried by the mold layer or the insulating layer, is over-etched by the laser.

2. The semiconductor package of claim 1, wherein insulating layer and the mold layer are formed of materials having coefficients of thermal expansion, wherein a difference of the coefficients of thermal expansion is in a range of 0 to 25 ppm/° C.

3. The semiconductor package of claim 2, wherein the insulating layer and the mold layer are in direct contact with each other in at least some sections.

4. The semiconductor package of claim 2, wherein each of the insulating layer and the mold layer is formed of a non-photosensitive material.

5. The semiconductor package of claim 4, wherein
   each of the insulating layer and the mold layer includes a filler, and
   a diameter of the filler is less than or equal to ¼ times a thickness of the insulating layer.

6. The semiconductor package of claim 1, further comprising:
   an external connection terminal configured to transmit an electrical signal to an external device;
   an external pad provided on the insulating layer and having the external connection terminal disposed thereon; and a conductive via formed between the external pad and the wiring pattern.

7. The semiconductor package of claim 6, wherein a height of the insulating layer is in a range of 10 to 50 μm.

8. The semiconductor package of claim 6, wherein the conductive via has a height corresponding to 0 to 95% of a height of the insulating layer.

9. The semiconductor package of claim 1, wherein
the object to be exposed is over-etched in a range between 0.01% and 30% of a thickness of the object to be exposed.

10. The semiconductor package of claim 1, wherein the mold layer is further formed to surround a side surface of the chip and an opposite surface opposite to the one surface on which the pad is formed.

11. The semiconductor package of claim 1, comprising a metal shielding layer formed on the other surface of the chip and the other surface of the mold layer, wherein the other surface of the chip is a surface opposite to one surface of the chip.

12. The semiconductor package of claim 1, comprising a metal shielding layer of a metal material, wherein the metal shielding layer is formed to surround the other surface and a side surface of the mold layer, and a side surface of the insulating layer.

13. The semiconductor package of claim 1, wherein an oxide passivation layer is formed on the wiring pattern.

14. The semiconductor package of claim 1, further comprising an embedded ground portion, wherein the embedded ground portion is formed inside the mold layer, and includes one side electrically connected to a ground electrode among the plurality of wiring patterns and the other side electrically connected to a metal shielding layer.

* * * * *